United States Patent
Hamazaki (10) Patent No.: US 11,280,692 B2
(45) Date of Patent: Mar. 22, 2022

(54) PRESSURE SENSOR DEVICE AND PRESSURE SENSOR MODULE INCLUDING SAME

(71) Applicant: Murata Manufacturing Co., Ltd., Nagaokakyo (JP)

(72) Inventor: Ryohei Hamazaki, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 261 days.

(21) Appl. No.: 16/383,870

(22) Filed: Apr. 15, 2019

(65) Prior Publication Data

US 2019/0242771 A1    Aug. 8, 2019

Related U.S. Application Data

(63) Continuation of application No. PCT/JP2017/033128, filed on Sep. 13, 2017.

(30) Foreign Application Priority Data

Dec. 20, 2016 (JP) .............................. JP2016-247055

(51) Int. Cl.
*G01L 9/12* (2006.01)
*G01L 1/14* (2006.01)
*G01L 9/00* (2006.01)
*H01L 29/84* (2006.01)

(52) U.S. Cl.
CPC ............. *G01L 9/12* (2013.01); *G01L 1/142* (2013.01); *G01L 9/00* (2013.01); *G01L 9/0072* (2013.01); *H01L 29/84* (2013.01)

(58) Field of Classification Search
CPC ....... G01L 9/0072; G01L 9/0073; G01L 9/12; G01L 9/0075; G01L 9/125; G01L 1/142; G01L 1/144; G01L 1/148
See application file for complete search history.

(56) References Cited

U.S. PATENT DOCUMENTS

| | | | |
|---|---|---|---|
| 4,823,230 A * | 4/1989 | Tiemann ............... | G01L 9/0072 29/25.42 |
| 5,186,054 A * | 2/1993 | Sekimura ............ | B60C 23/0408 361/283.4 |
| 5,528,452 A | 6/1996 | Ko | |

(Continued)

FOREIGN PATENT DOCUMENTS

| CN | 104848970 A | 8/2015 |
|---|---|---|
| CN | 105899924 A | 8/2016 |

(Continued)

OTHER PUBLICATIONS

Official Communication issued in corresponding Chinese Patent Application No. 201780079135.3, dated Jul. 6, 2020.

(Continued)

*Primary Examiner* — Herbert K Roberts
(74) *Attorney, Agent, or Firm* — Keating & Bennett, LLP (57) ABSTRACT

A pressure sensor device in a pressure sensor module includes a membrane that is conductive and deformable under pressure, fixed electrodes each including an electrode surface opposed to the membrane, and a dielectric film disposed on the electrode surface of each of the fixed electrodes. The fixed electrodes are disposed in a direction from the center of the membrane toward an outer portion.

24 Claims, 6 Drawing Sheets

(56) References Cited

U.S. PATENT DOCUMENTS

| | | | | |
|---|---|---|---|---|
| 9,791,340 B2* | 10/2017 | Bilic | ................. | G01L 9/0042 |
| 2007/0209443 A1* | 9/2007 | Yoshikawa | ............. | G01L 9/125 |
| | | | | 73/718 |
| 2013/0118265 A1* | 5/2013 | Besling | ................. | G01L 9/125 |
| | | | | 73/724 |
| 2014/0338459 A1* | 11/2014 | Besling | ................. | G01L 13/025 |
| | | | | 73/718 |
| 2016/0305836 A1 | 10/2016 | Rossberg et al. | | |

FOREIGN PATENT DOCUMENTS

| | | | | |
|---|---|---|---|---|
| JP | 60-46049 U | 4/1985 | | |
| JP | 10-509241 A | 9/1998 | | |
| JP | 2005-331328 A | 12/2005 | | |
| JP | 2005-351744 A | 12/2005 | | |
| JP | 2005351744 A * | 12/2005 | ............... | G01L 9/12 |
| JP | 2007-303922 A | 11/2007 | | |
| JP | 2008-070124 A | 3/2008 | | |
| JP | 2013-104797 A | 5/2013 | | |
| JP | 2014-115099 A | 6/2014 | | |
| JP | 2014-174060 A | 9/2014 | | |
| WO | WO-2010125601 A1 * | 11/2010 | ........... | G01L 9/0073 |

OTHER PUBLICATIONS

Official Communication issued in International Patent Application No. PCT/JP2017/033128, dated Dec. 12, 2017.

Luo et al., "A 100 μm diameter capacitive pressure sensor with 50 MPa dynamic range" Journal of Micromechanics and Microengineering, IOP Publishing, Mar. 7, 2016, pp. 1-11.

Wang et al., "Modeling of touch mode capacitive sensors and diaphragms", Sensors and Actuators, vol. 75, Feb. 12, 1999, pp. 230-241.

* cited by examiner

PRESSURE SENSOR DEVICE AND PRESSURE SENSOR MODULE INCLUDING SAME

CROSS REFERENCE TO RELATED APPLICATIONS

This application claims the benefit of priority to Japanese Patent Application No. 2016-247055 filed on Dec. 20, 2016 and is a Continuation Application of PCT Application No. PCT/JP2017/033128 filed on Sep. 13, 2017. The entire contents of each of these applications are hereby incorporated herein by reference.

BACKGROUND OF THE INVENTION

1. Field of the Invention

The present invention relates to a pressure sensor device for measuring pressure, such as atmospheric pressure, and to a pressure sensor module including the same.

2. Description of the Related Art

There are known pressure sensors of the electrostatic capacitance type, one example of which is described in Japanese Unexamined Patent Application Publication No. 2013-104797. In particular, the pressure sensor described in Japanese Unexamined Patent Application Publication No. 2013-104797 is called a touch-mode pressure sensor. The touch-mode pressure sensor includes a membrane that deforms under pressure, a fixed electrode having an electrode surface opposed to the membrane with a gap, and a dielectric layer disposed on the electrode surface. In the pressure sensor described in Japanese Unexamined Patent Application Publication No. 2013-104797, a surface portion of the dielectric layer opposed to the central portion of the membrane includes a recessed portion (recess).

In such a touch-mode pressure sensor, when pressure to the membrane increases, first, the electrostatic capacitance between the membrane and the fixed electrode is increased by a decrease in the distance between the membrane and the dielectric layer. After the membrane comes into contact with the dielectric layer, when the pressure to the membrane further increases, the electrostatic capacitance between the membrane and the fixed electrode is increased by an increase in the area of contact between the membrane and the dielectric layer.

In the pressure sensor described in Japanese Unexamined Patent Application Publication No. 2013-104797, because the dielectric layer includes the recessed portion, the degrees of linearity between the pressure to the membrane and the electrostatic capacitance before and after the membrane comes into contact with the dielectric layer do not noticeably differ from each other. Therefore, the pressure sensor described in Japanese Unexamined Patent Application Publication No. 2013-104797 is able to operate with high measurement accuracy.

In the pressure sensor described in Japanese Unexamined Patent Application Publication No. 2013-104797, however, it is necessary to form the dielectric layer on the electrode surface of the fixed electrode and then partially remove (etch) the dielectric layer to form the recessed portion in the dielectric layer. Thus, the shape of the recessed portion in the dielectric layer tends to vary with processing. Examples of such variations may include the depth of the recessed portion and the smoothness of the bottom surface of the recessed portion. This leads to variations in the electrostatic capacitance between the membrane and the fixed electrode and also to variations in the linearity of changes in the electrostatic capacitance in response to changes in the pressure to the membrane. As a result, the pressure sensor may not be able to obtain desired linearity and may be unable to measure the pressure with high accuracy.

SUMMARY OF THE INVENTION

Preferred embodiments of the present invention provide pressure sensor devices that are each capable of obtaining desired linearity of changes in electrostatic capacitance between a membrane and a fixed electrode in response to changes in the pressure to the membrane and, thus, capable of measuring pressure with high accuracy and to provide pressure sensor modules each including a pressure sensor device according to a preferred embodiment of the present invention.

A pressure sensor device according to a preferred embodiment of the present invention includes a membrane that is conductive and deformable under pressure, a plurality of fixed electrodes each including an electrode surface opposed to the membrane, and a dielectric film disposed on the electrode surface of each of the plurality of fixed electrodes, wherein the plurality of fixed electrodes are disposed in a direction from a center of the membrane toward an outer portion thereof.

In a pressure sensor device according to a preferred embodiment of the present invention, the plurality of fixed electrodes include a central fixed electrode opposed to a central portion of the membrane.

In a pressure sensor device according to a preferred embodiment of the present invention, the plurality of fixed electrodes further include an outer fixed electrode surrounding the central fixed electrode and having a ring shape.

In a pressure sensor device according to a preferred embodiment of the present invention, a float electrode disposed between neighboring fixed electrodes of the plurality of fixed electrodes and not electrically connected to the neighboring fixed electrodes is provided.

A pressure sensor module for measuring pressure according to a preferred embodiment of the present invention includes a pressure sensor device including a membrane that is conductive and deformable under pressure, a plurality of fixed electrodes each including an electrode surface opposed to the membrane, and a dielectric film disposed on the electrode surface of each of the plurality of fixed electrodes, the plurality of fixed electrodes being disposed in a direction from a center of the membrane toward an outer portion thereof, and a sensor controller to calculate pressure to the membrane based on an electrostatic capacitance between the membrane and one of the plurality of fixed electrodes and to output the calculated value as an output pressure value therefrom, wherein a pressure measurement range is divided into a plurality of pressure segments, and in calculation of the pressure within at least one of the pressure segments, the sensor controller uses a fixed electrode with an electrostatic capacitance that changes in response to pressure changes in the pressure segment more linearly than that of the other fixed electrode(s).

In a pressure sensor module according to a preferred embodiment of the present invention, the plurality of fixed electrodes include the central fixed electrode and an outer fixed electrode surrounding the central fixed electrode and having a ring shape, the plurality of pressure segments include a first pressure segment extending to pressure at which the membrane comes into contact with the central fixed electrode, a second pressure segment extending from the pressure at which the membrane comes into contact with the central fixed electrode to pressure at which the membrane comes into contact with the outer fixed electrode, and a third pressure segment corresponding to pressure higher than the pressure at which the membrane comes into contact with the outer fixed electrode, the output pressure value is calculated using a correction formula for the electrostatic capacitance, and the correction formulae used for the plurality of pressure segments are different from each other.

According to preferred embodiments of the present invention, pressure sensor devices that are each capable of obtaining desired linearity of changes in electrostatic capacitance between a membrane and a fixed electrode in response to changes in the pressure to the membrane and, thus, capable of measuring pressure with high accuracy, and pressure sensor modules including pressure sensor devices according to preferred embodiments of the present invention are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the accompanying drawings.

First Preferred Embodiment

Figure 1:
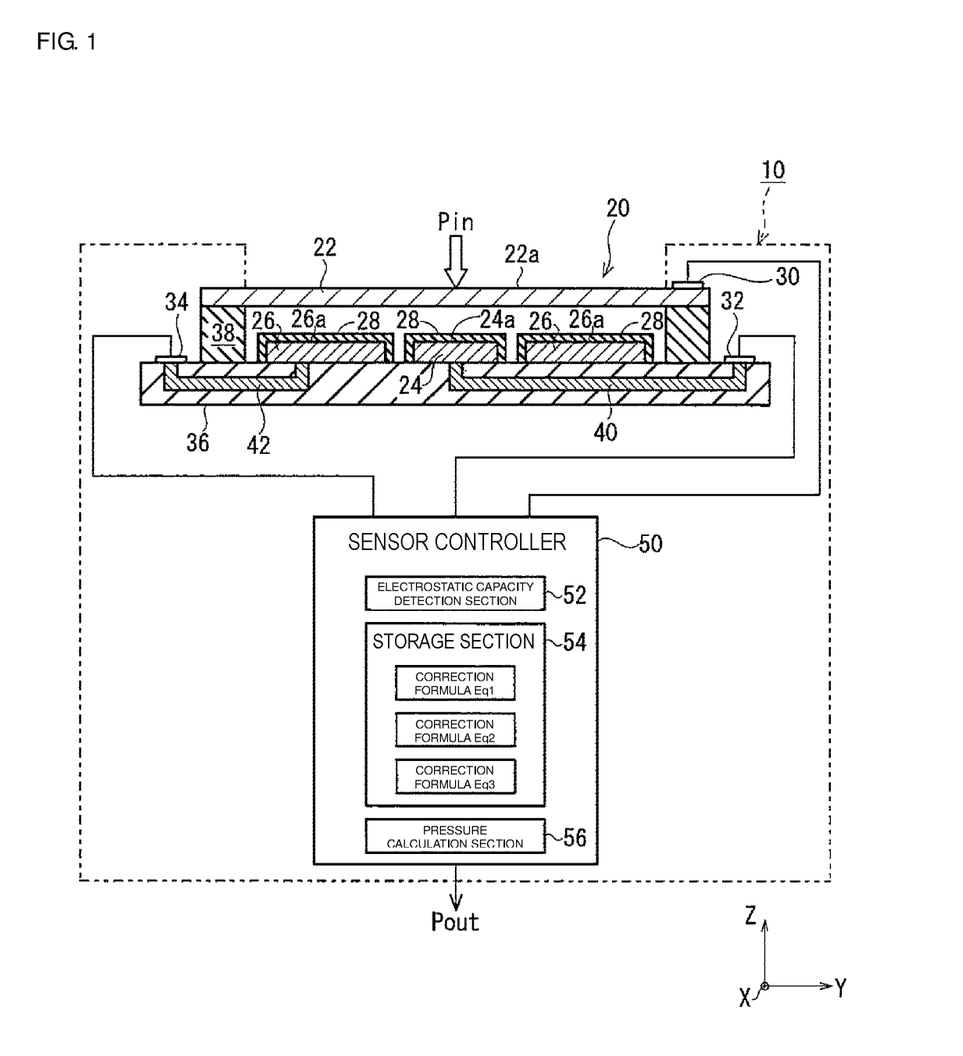
FIG. 1 is a schematic diagram of a pressure sensor module according to a first preferred embodiment of the present invention.

FIG. 1 is a schematic diagram of a configuration of a pressure sensor module according to a first preferred embodiment of the present invention. X-Y-Z illustrated in the drawings is intended to facilitate the understanding and does not restrict the present invention. The X-axis direction indicates a direction of the depth of the pressure sensor module, the Y-axis direction indicates a direction of its width, and the Z-axis direction indicates a direction of its thickness (height).

As illustrated in FIG. 1, a pressure sensor module 10 according to the first preferred embodiment is an electrostatic capacitance pressure sensor module, in particular, preferably a touch-mode pressure sensor module, for example, and includes a pressure sensor device 20 and a sensor controller 50.

As illustrated in FIG. 1, the pressure sensor device 20 includes a membrane 22 that is deformable under pressure to be measured, for example, atmospheric pressure, a plurality of fixed electrodes 24 and 26 opposed to the membrane 22, and a dielectric film 28 disposed on the plurality of fixed electrodes 24 and 26. In the drawings, Pin indicates a real value (real pressure value) of the pressure to be measured, and Pout indicates a detected value (calculated value) of pressure by the pressure sensor module 10 and indicates an output value (output pressure value) output therefrom.

The pressure sensor device 20 includes a membrane terminal 30 electrically connected to the membrane 22 and electrode terminals 32 and 34 electrically connected to the fixed electrodes 24 and 26, respectively.

The membrane 22 in the pressure sensor device 20 has elasticity and conductivity preferably by being made of, for example, a conductive silicon material. The outer edge of the membrane 22 is supported by a spacer 38 having a frame shape disposed on a substrate 36. The membrane 22 includes a pressure receiving surface 22a exposed to the outside of the pressure sensor module 10 and structured to receive pressure to be measured. When the pressure receiving surface 22a receives the pressure, the membrane 22 bends and deforms toward a side opposite to the pressure receiving surface, that is, toward a fixed-electrode side. The membrane 22 may partially have conductivity. For example, a portion of the membrane 22 opposed to the fixed electrodes 24 and may preferably be made of a conductive material, and its peripheral portion may be made of a different elastic material.

An example of each of the fixed electrodes 24 and 26 may preferably be a conductor made of a conductive polysilicon material and is disposed inside the spacer 38 and on the substrate 36. The fixed electrode 24 includes an electrode surface 24a opposed to the membrane 22. The fixed electrode 26 also includes an electrode surface 26a opposed to the membrane 22.

Figure 2:
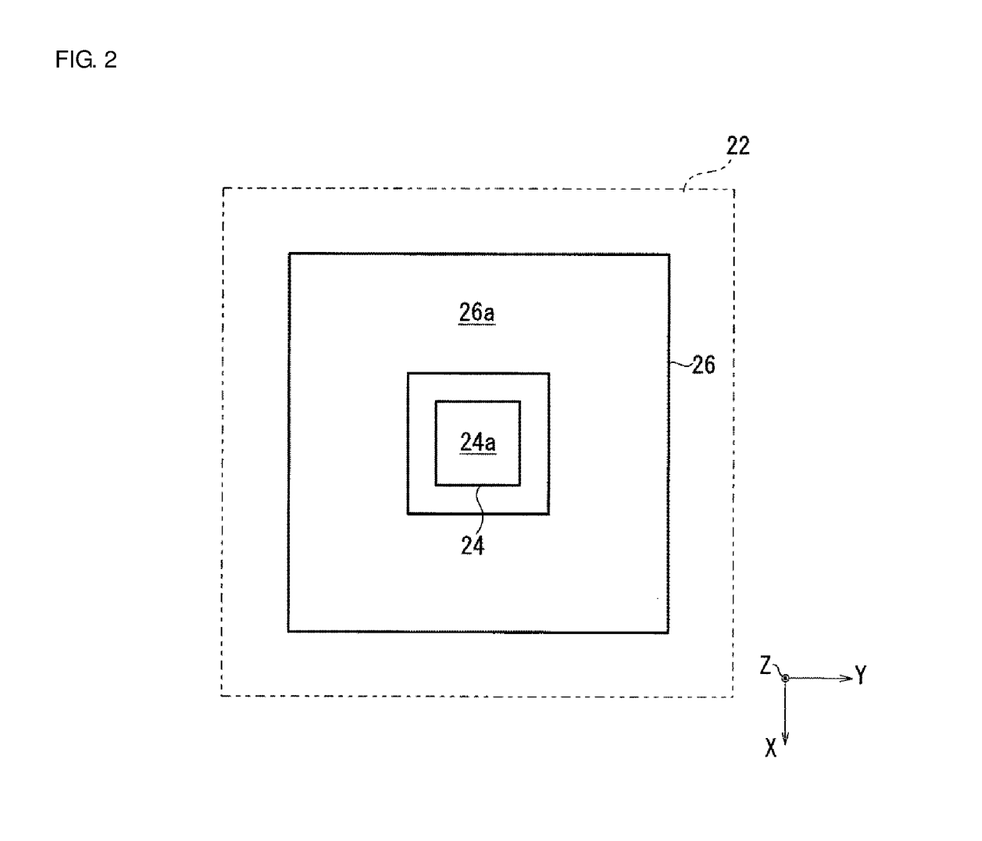
FIG. 2 is a top view that illustrates shapes of a plurality of fixed electrodes and a layout thereof.

When the fixed electrodes 24 and 26 are seen from the side of the membrane 22 (seen along the Z-axis direction), as illustrated in FIG. 2, the fixed electrode 24 is disposed in a location opposed to the central portion of the membrane 22. Hereinafter, the fixed electrode 24 is referred to as central fixed electrode 24. In the first preferred embodiment, the central fixed electrode 24 preferably has, for example, a square or substantially square shape.

The fixed electrode 26 is a ring-shaped electrode surrounding the central fixed electrode 24 with a gap therebetween. That is, the fixed electrode 26 is positioned outside the central fixed electrode 24. Hereinafter, the fixed electrode 26 is referred to as outer fixed electrode 26. In the first preferred embodiment, the outer fixed electrode 26 includes an outer perimeter and an inner perimeter each preferably having square or substantially square shapes, for example.

The dielectric film 28 is preferably a thin film made of a dielectric material, for example, and, as illustrated in FIG. 1, is disposed on each of the electrode surface 24a of the central fixed electrode 24 and the electrode surface 26a of the outer fixed electrode 26. In the first preferred embodiment, the dielectric film 28 covers not only the electrode surfaces 24a and 26a, but also the other portions of the central fixed electrode 24 and outer fixed electrode 26.

If the central fixed electrode 24 and the outer fixed electrode 26 are spaced away from each other by a sufficient distance and a leak current does not occur between the central fixed electrode 24 and outer fixed electrode 26, the dielectric film 28 may be disposed on only the electrode surfaces 24a and 26a. Instead of a configuration in which the dielectric film 28 is disposed independently on each of the central fixed electrode 24 and the outer fixed electrode 26, the central fixed electrode 24 and outer fixed electrode 26 may be embedded in a single dielectric layer.

As illustrated in FIG. 1, the membrane terminal 30 is disposed on the membrane 22 and electrically connected to the membrane 22. The electrode terminals 32 and 34 are disposed on the substrate 36. The electrode terminal 32 is electrically connected to the central fixed electrode 24 with an intra-substrate wire 40 interposed therebetween. The electrode terminal 34 is electrically connected to the outer fixed electrode 26 with an intra-substrate wire 42 interposed therebetween. The membrane terminal 30 and the electrode terminals 32 and 34 are connected to the sensor controller 50.

The sensor controller 50 is configured and/or programmed to calculate an output pressure value Pout as a detected value of pressure received by the membrane 22 based on the electrostatic capacitance between the membrane 22 and each of the plurality of fixed electrodes (central and outer fixed electrodes) 24 and 26 and to output the calculated output pressure value Pout therefrom.

Specifically, the sensor controller 50 includes an electrostatic capacitance detector 52 to detect an electrostatic capacitance Ca between the membrane 22 and the central fixed electrode 24 and an electrostatic capacitance Cb between the membrane 22 and the outer fixed electrode 26. The sensor controller 50 further includes a storage 54 to store a plurality of correction formulae Eq1 to Eq3 used to calculate the output pressure values Pout based on the electrostatic capacitances detected by the electrostatic capacitance detector 52. The sensor controller 50 further includes a pressure calculator 56 to correct the electrostatic capacitances detected by the electrostatic capacitance detection section 52 to the output pressure values Pout (to calculate the output pressure values Pout) using the correction formulae stored in the storage 54.

The electrostatic capacitance detector 52 includes an electrostatic capacitance sensor or a capacitor defining a portion of circuitry to detect the electrostatic capacitances Ca and Cb between the membrane terminal 30 and each of the fixed electrodes (central and outer fixed electrodes) 24 and 26. In response to changes in the pressure received by the membrane 22 (real pressure value Pin), the electrostatic capacitances Ca and Cb detected by the electrostatic capacitance detector 52 also change.

One example of the storage 54 may be memory that stores the plurality of correction formulae Eq1 to Eq3 to correct the electrostatic capacitances Ca and Cb detected by the electrostatic capacitance detector 52 to the output pressure values Pout (to calculate the output pressure values Pout). The correction formulae Eq1 to Eq3 to calculate the output pressure values Pout are functions for electrostatic capacitances, and examples thereof may be, for example, higher order polynomials. The reason for preparing the plurality of correction formulae Eq1 to Eq3 will be described below.

One example of the pressure calculator 56 may preferably be a processor capable of obtaining the electrostatic capacitances Ca and Cb detected by the electrostatic capacitance detector 52, obtaining the correction formulae Eq1 to Eq3 (correction formula data) from the storage 54, and calculating the output pressure values Pout based on the electrostatic capacitance signals and the correction formula data. One example of the processor may preferably calculate the output pressure value Pout by executing a program to correct the electrostatic capacitances Ca and Cb to the output pressure values Pout using the correction formulae Eq1 to Eq3.

More specifically, the sensor controller 50 uses the electrostatic capacitance between the membrane 22 and either one of the plurality of fixed electrodes (central and outer fixed electrodes) 24 and 26 to calculate the output pressure value Pout. That is, the sensor controller 50 uses an appropriate fixed electrode of the plurality of fixed electrodes 24 and 26 to calculate the output pressure value Pout the same or substantially the same as the real pressure value Pin with high accuracy. This is described more specifically below.

Figure 3:
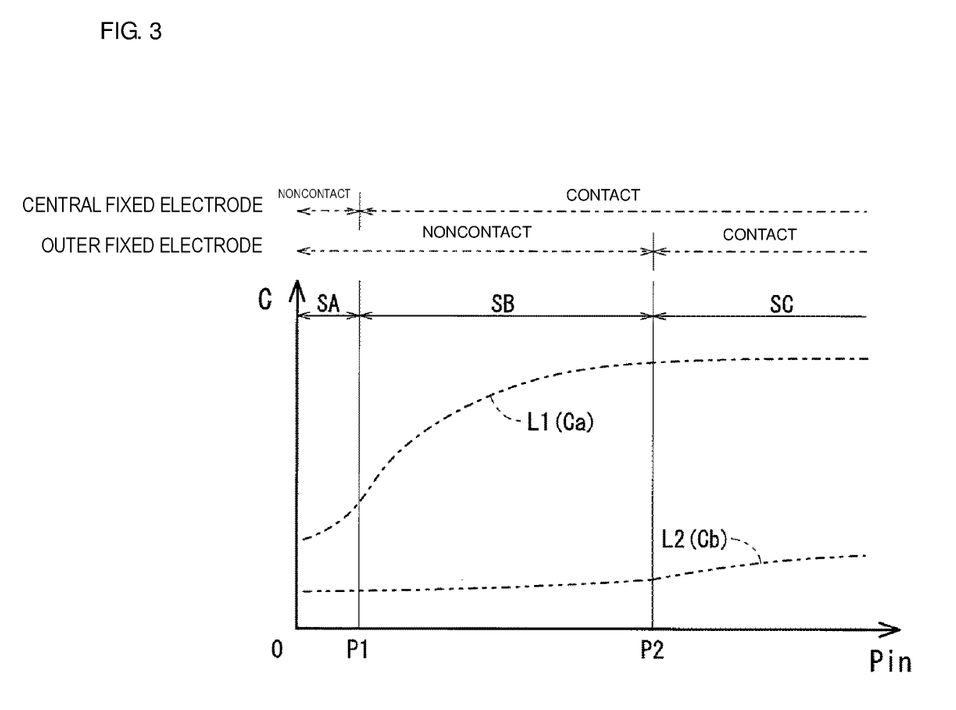
FIG. 3 illustrates a pressure-electrostatic capacitance curve expressing changes in electrostatic capacitance between a membrane and a central fixed electrode and a pressure-electrostatic capacitance curve expressing changes in electrostatic capacitance between the membrane and an outer fixed electrode.

FIG. 3 illustrates a pressure-electrostatic capacitance curve L1 (dot-and-dash line) expressing changes in the electrostatic capacitance Ca between the membrane 22 and the central fixed electrode 24 and a pressure-electrostatic capacitance curve L2 (dot-dot-dash line) expressing changes in the electrostatic capacitance Cb between the membrane 22 and the outer fixed electrode 26, in response to changes in the real pressure value Pin of pressure received by the membrane 22.

In previous behavior, when the pressure receiving surface 22a starts receiving pressure, the membrane 22 starts deforming at its central portion. Then, when the pressure increases, the pressure receiving surface 22a is bowed inwardly, the membrane 22 comes into contact with the dielectric film 28 on the central fixed electrode 24, and finally, also comes into contact with the dielectric film 28 on the outer fixed electrode 26.

When the real pressure value Pin of the pressure received by the membrane 22 increases from zero, first, the central portion of the membrane 22 approaches the central fixed electrode 24. Thus, in response to that pressure rise, the distance between the central portion of the membrane 22 and the central fixed electrode 24 substantially linearly decreases, and the electrostatic capacitance Ca between the membrane 22 and the central fixed electrode 24 substantially linearly increases. At this time, the distance between the membrane 22 and the outer fixed electrode 26 also decreases, but that decrease is smaller than that of the decrease in the distance between the membrane 22 and the central fixed electrode 24. Therefore, the electrostatic capacitance Cb between the membrane 22 and the outer fixed electrode 26 substantially linearly increases slightly.

The "linear" changes in B in response to changes in A (changes with high "linearity") in the present specification mean changes in which the shape of a curve whose horizontal axis is A and vertical axis is B becomes a linear or an approximately linear shape in broad perspective.

When the real pressure value Pin of the pressure received by the membrane 22 further increases and reaches P1, the central portion of the membrane 22 comes into contact with the central fixed electrode 24 with the dielectric film 28 interposed therebetween. At this time, the outer fixed electrode 26, which is positioned outside the central fixed electrode 24, does not come into contact with the membrane 22 yet.

When the real pressure value Pin of the pressure received by the membrane 22 increases from P1, in response to that pressure rise, the area of contact between the membrane 22 and the dielectric film 28 on the central fixed electrode 24 substantially nonlinearly increases. As a result, the linearity of changes in the electrostatic capacitance Ca between the membrane 22 and the central fixed electrode 24 decreases (that is, the changes become nonlinear), in comparison with the linearity before the membrane 22 comes into contact with the dielectric film 28 on the central fixed electrode 24 (in comparison with the linearity before the real pressure value Pin reaches P1). At this time, the outer fixed electrode 26 does not come into contact with the membrane 22 yet, the distance to the membrane 22 in response to the pressure rise linearly decreases, and the electrostatic capacitance Cb linearly increases.

When the real pressure value Pin of the pressure received by the membrane 22 further increases and reaches P2, the membrane 22 comes into contact with the outer fixed electrode 26 with the dielectric film 28 interposed therebetween. Then, when the real pressure value Pin further increases from P2, in response to that pressure rise, the area of contact between the membrane 22 and the dielectric film 28 on the outer fixed electrode 26 substantially nonlinearly increases. As a result, the linearity of changes in the electrostatic capacitance Cb between the membrane 22 and the outer fixed electrode 26 decreases (that is, the changes become nonlinear), in comparison with the linearity before the membrane 22 comes into contact with the dielectric film 28 on the outer fixed electrode 26 (in comparison with the linearity before the real pressure value Pin reaches P2).

As described above, before the membrane 22 comes into contact with the dielectric film 28 on the fixed electrodes (central and outer fixed electrodes) 24 and 26, the electrostatic capacitances Ca and Cb increase in response to pressure changes with relatively high linearity in accordance with the decrease in the distance between the fixed electrodes (central and outer fixed electrodes) 24 and 26 and the membrane 22. In contrast, after the contact with the membrane 22, the electrostatic capacitances Ca and Cb increase in response to pressure changes with relatively low linearity (nonlinearly) in accordance with the increase in the area of contact between the dielectric film 28 on the fixed electrodes (central and outer fixed electrodes) 24 and 26 and the membrane 22. In particular, immediately after the contact with the membrane 22, the linearity is considerably low.

As illustrated in FIG. 3, the contact between the membrane 22 and the dielectric film 28 on the central fixed electrode 24 and the contact between the membrane 22 and the dielectric film 28 on the outer fixed electrode 26 occur at different real pressure values Pin; the former occurs at P1, and the latter occurs at P2, which is larger than P1. One reason for this is that the membrane 22 starts deforming at its central portion. Another reason is that the central fixed electrode 24 is opposed to the central portion of the membrane 22 and that central fixed electrode 24 is surrounded by the outer fixed electrode 26, that is, the central fixed electrode 24 and outer fixed electrode 26 are substantially aligned in the direction from the center of the membrane 22 toward its outer portion.

In consideration of the above-described circumstances, the pressure measurement range for the pressure sensor module 10 is divided into a plurality of pressure segments SA, SB, and SC (first to third pressure segments). In measurement (calculation) of pressure within the pressure segments SA, SB, and SC, a fixed electrode with an electrostatic capacitance that changes in response to pressure changes more linearly (in which changes in electrostatic capacitance with higher linearity occur) than that of the other fixed electrode is used in each of the pressure segments.

Figure 4:
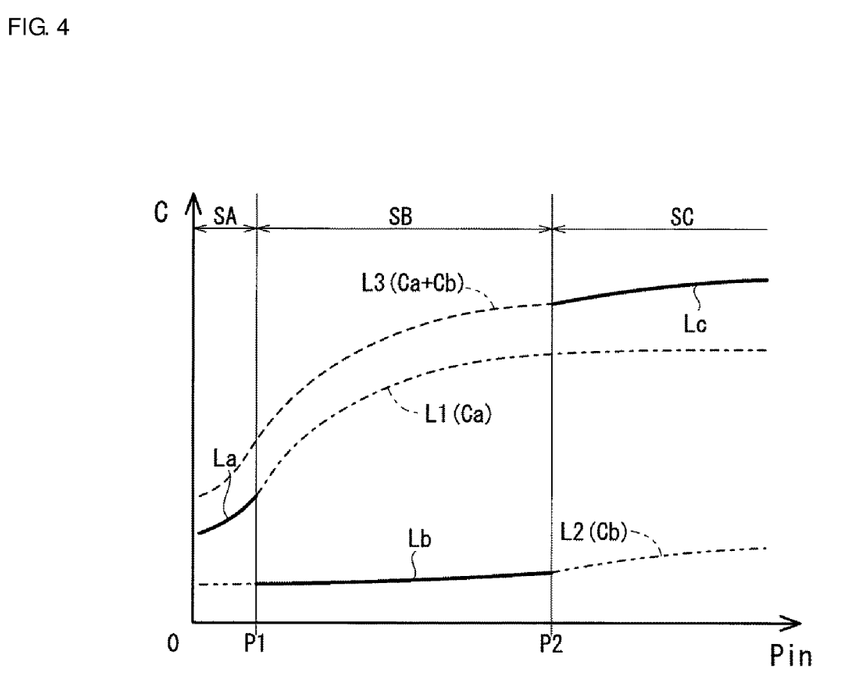
FIG. 4 illustrates portions of the pressure-electrostatic capacitance curves used to calculate an output pressure value of the pressure sensor module.

The pressure segment SA is the range in which the real pressure value Pin of the pressure received by the membrane 22 is zero to P1, as illustrated in FIG. 3. In the pressure segment SA, both of the electrostatic capacitance Ca between the membrane 22 and the central fixed electrode 24 and the electrostatic capacitance Cb between the membrane 22 and the outer fixed electrode 26 substantially linearly change in response to pressure changes, but the degree of the changes in the electrostatic capacitance Ca is larger. That is, the sensitivity (the amount of changes in electrostatic capacitance per unit pressure) is higher. Thus, as illustrated in FIG. 4, which indicates the electrostatic capacitance used for calculation of the output pressure value of the pressure sensor module, within the pressure segment SA, a portion La of the pressure-electrostatic capacitance curve L1 is used to calculate the output pressure value Pout. That is, that portion La corresponds to the correction formula Eq1. Accordingly, the central fixed electrode 24 and the correction formula Eq1 are used to measure the pressure within the pressure segment SA.

Next, the pressure segment SB is the range in which the real pressure value Pin of the pressure received by the membrane 22 is P1 to P2, as illustrated in FIG. 3. In the pressure segment SB, the electrostatic capacitance Ca between the membrane 22 and the central fixed electrode 24 substantially nonlinearly changes. In contrast, the electrostatic capacitance Cb between the membrane 22 and the outer fixed electrode 26 changes with higher linearity than that of the electrostatic capacitance Ca. Thus, as illustrated in FIG. 4, within the pressure segment SB, a portion Lb of the pressure-electrostatic capacitance curve L2 is used to calculate the output pressure value Pout. That is, the portion Lb corresponds to the correction formula Eq2. Accordingly, the outer fixed electrode 26 and the correction formula Eq2 are used to measure the pressure within the pressure segment SB.

The pressure segment SC is the range in which the real pressure value Pin of the pressure received by the membrane 22 is P2 to the upper limit pressure of measurement by the pressure sensor module 10, as illustrated in FIG. 3. The upper limit pressure of measurement is the pressure at which the electrostatic capacitances Ca and Cb remain unchanged, that is, at which the area of contact between the membrane 22 and the dielectric film 28 on each of the fixed electrodes 24 and 26 does not increase even when the pressure increases.

In the pressure segment SC, the electrostatic capacitance Ca between the membrane 22 and the central fixed electrode 24 remains virtually unchanged. This is because the membrane 22 is in contact with all or approximately all of the electrode surface 24a of the central fixed electrode 24 with the dielectric film 28 interposed therebetween. In contrast, the electrostatic capacitance Cb between the membrane 22 and the outer fixed electrode 26 substantially nonlinearly changes in response to pressure changes. However, in an outer portion of the membrane 22 in contact with the outer fixed electrode 26 (portion near the spacer 38), because the amount of displacement caused by the pressure rise is small, the degree of changes in the electrostatic capacitance Cb is small (for example, in comparison with the degree of changes in the electrostatic capacitance Ca in the pressure segment SB). Accordingly, each of the electrostatic capacitances Ca and Cb has low sensitivity to pressure changes in the pressure segment SC.

Thus, as illustrated in FIG. 4, in the pressure segment SC, a portion Lc of the pressure-electrostatic capacitance curve L3, which indicates changes in the sum of the electrostatic capacitance Ca and electrostatic capacitance Cb (total electrostatic capacitance), is used for the output pressure value Pout. That is, that portion Lc corresponds to the correction formula Eq3. Accordingly, both of the central fixed electrode 24 and the outer fixed electrode 26 and the correction formula Eq3 are used to measure the pressure within the pressure segment SC.

In this manner, the pressure measurement range is divided into the plurality of pressure segments, and one or both of the central fixed electrode 24 and the outer fixed electrode 26 are used appropriately, depending on the pressure segment. The central fixed electrode 24 and the outer fixed electrode 26 are aligned substantially in the direction from the center of the membrane 22 toward its outer portion. In addition, the correction formulae used in the pressure segments are different from each other. Thus, the pressure sensor module 10 is able to have desired pressure-electrostatic capacitance characteristics in which the electrostatic capacitance linearly changes in response to pressure changes over all or substantially all of the pressure measurement range (desired linearity) without providing a recessed portion in the dielectric film 28 on each of the fixed electrodes.

Figure 5:
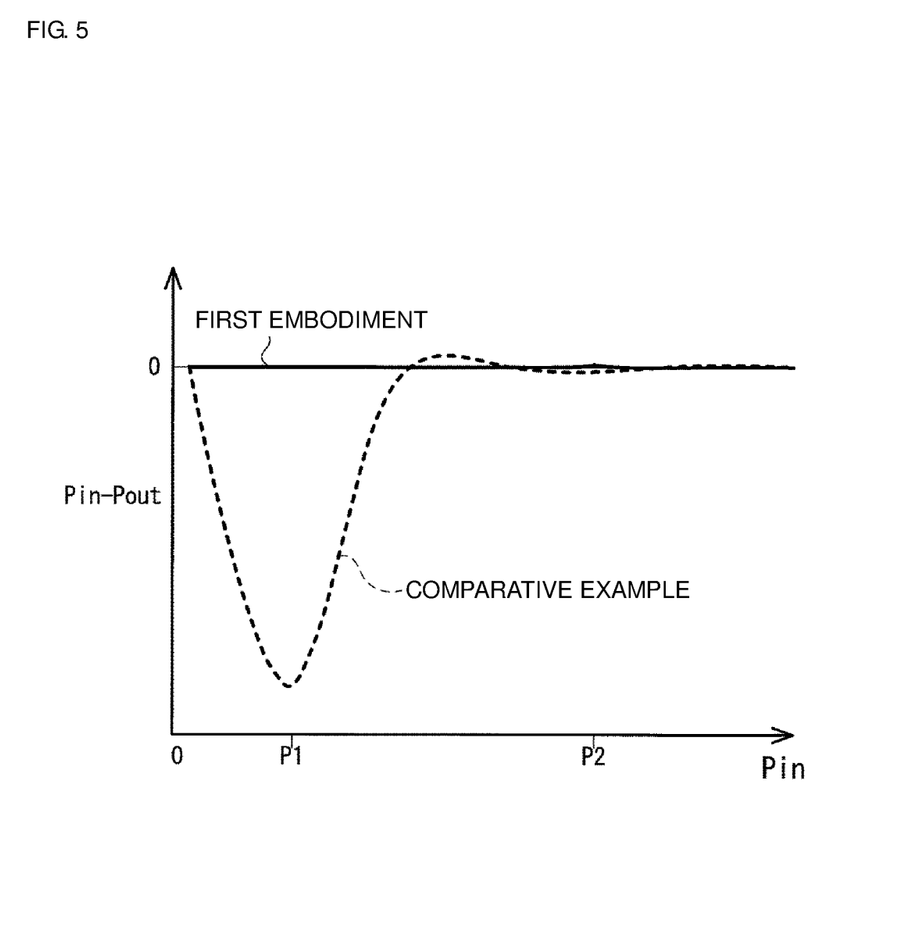
FIG. 5 illustrates a difference between the output pressure value of the pressure sensor module and a real pressure value.

As a result, the pressure sensor module 10 according to the first preferred embodiment is able to calculate the output pressure value Pout in which the difference from the real pressure value Pin is approximately zero over all or substantially all of the pressure measurement range, as illustrated in FIG. 5. Accordingly, the pressure sensor module 10 is able to measure the pressure with high accuracy over the wide pressure measurement range.

The broken line illustrated in FIG. 5 indicates the difference between the real pressure value and the output pressure value of a pressure sensor module according to a comparative example. Unlike the pressure sensor device in the pressure sensor module in the first preferred embodiment, the pressure sensor device in the comparative example detects the electrostatic capacitance using a single fixed electrode. It corrects the electrostatic capacitance between the membrane and the single fixed electrode to the output pressure value using a single correction formula.

The pressure sensor module according to the comparative example is able to measure the pressure with high accuracy in a range in which the real pressure value is large, as illustrated in FIG. 5, but its measurement accuracy is low in a range in which the real pressure value is small. That is, the measurement accuracy is low until the membrane comes into contact with the fixed electrode and for a certain period immediately after the membrane comes into contact with the fixed electrode.

This is because the single correction formula enabling the electrostatic capacitance to be corrected to the output pressure value that is the same or substantially the same as the real pressure value in the range in which the real pressure value is large is used in the range in which the real pressure value is small, that range in which the linearity of changes in the electrostatic capacitance in response to pressure changes is low. That is, in the case in which the single fixed electrode is used, there is a portion in which the linearity in changes of the electrostatic capacitance in response to pressure changes is, to one degree to another, low. For example, for the electrostatic capacitance Ca in the pressure segment SB illustrated in FIG. 3, its linearity is low for a certain period immediately after the membrane comes into contact with the fixed electrode. Because the single correction formula suited for the range in which the real pressure value is large is used in the above-described low-linearity range in which the real pressure value is small, the pressure module in the comparative example operates with low measurement accuracy in the range in which the real pressure value is small.

Accordingly, a pressure sensor module that uses a single fixed electrode, that is, a single correction formula, such as the pressure sensor module in the comparative example, has a narrower measurement range for pressure measurement with high accuracy (in comparison with the pressure sensor module 10 in the first preferred embodiment, which selectively uses the plurality of fixed electrodes and uses the correction formula corresponding to each of the fixed electrodes).

As described above, according to the first preferred embodiment, the pressure sensor device 20 capable of obtaining desired linearity of changes in the electrostatic capacitance between the membrane 22 and the fixed electrode in response to changes in the pressure to the membrane 22 and, thus, capable of measuring pressure with high accuracy and the pressure sensor module 10 including the pressure sensor device 20 is able to be provided.

The present invention, which has been described with reference to the first preferred embodiment, is not restricted to the above-described preferred embodiment.

For example, in the above-described first preferred embodiment, as illustrated in FIG. 2, the central fixed electrode 24 and the outer fixed electrode 26 are separated from each other to reduce the occurrence of a leak current between them. To further reduce or prevent the occurrence of the leak current, as in a pressure sensor module according to a second preferred embodiment of the present invention illustrated in FIG. 6, a ring-shaped float electrode 240 may preferably be disposed between the central fixed electrode 24 and the outer fixed electrode 26.

Figure 6:
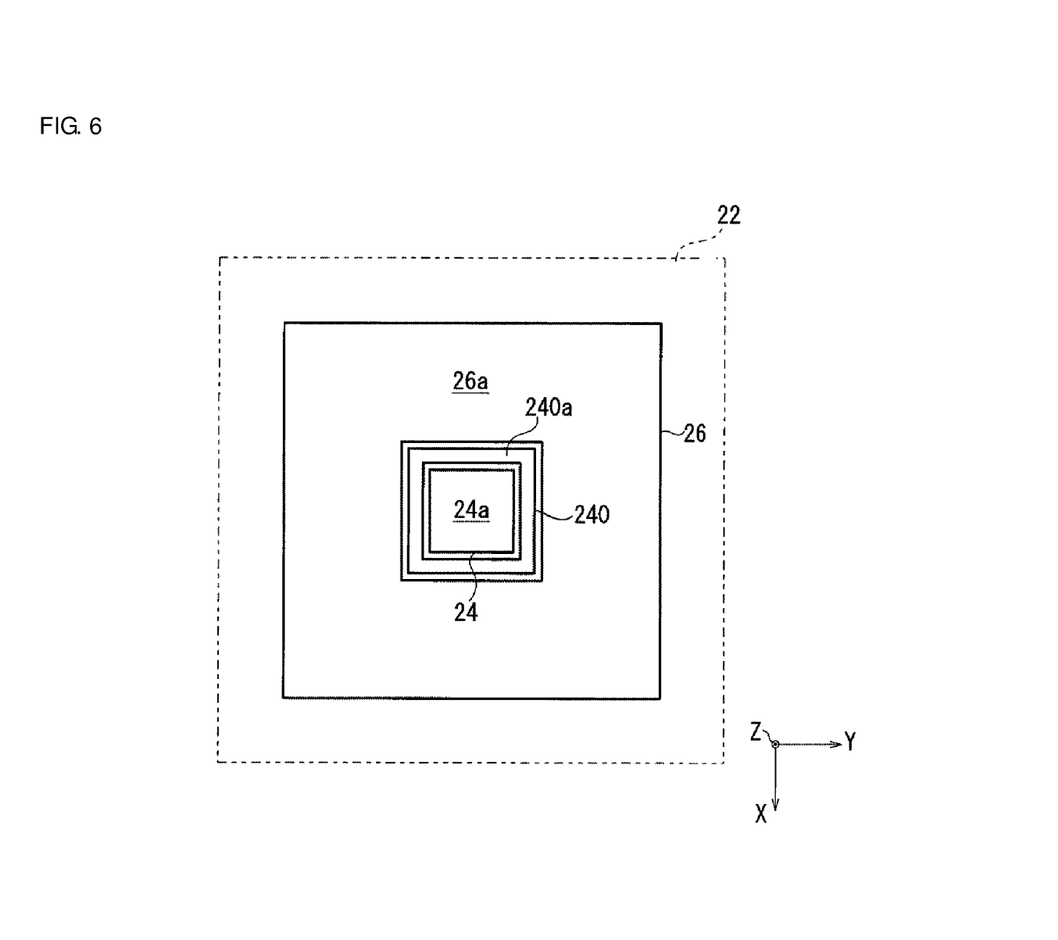
FIG. 6 is a top view that illustrates a float electrode arranged between a central fixed electrode and an outer fixed electrode in a pressure sensor module according to a second preferred embodiment of the present invention.

The float electrode 240 is not electrically connected to the central fixed electrode 24 or the outer fixed electrode 26, and may be connected to, for example, a ground pattern (not illustrated) on the substrate 36, and have a ground potential.

The float electrode 240 includes an electrode surface 240a opposed to the membrane 22 and overlaid with an insulating film. This reduces or prevents cases in which the membrane 22 comes into contact with the float electrode 240 and becomes the ground potential.

That is, the float electrode is disposed between neighboring fixed electrodes of a plurality of fixed electrodes and not electrically connected to the neighboring electrodes and reduces or prevents the occurrence of a leak current between the neighboring fixed electrodes.

In the previously described first preferred embodiment, as illustrated in FIG. 2, the pressure sensor device 20 includes the two fixed electrodes 24 and 26. In preferred embodiments of the present invention, however, the number of fixed electrodes is not limited to two and may be any number more than one.

Furthermore, in the above-described first preferred embodiment, as illustrated in FIG. 2, the central fixed electrode 24 has a square or substantially square shape, and the outer fixed electrode 26, which surrounds the central fixed electrode 24, has a square or substantially rectangular frame shape. Preferred embodiments of the present invention are not restricted to that configuration. For example, the central fixed electrode may have a circular or substantially circular shape, and the outer electrode, which surrounds that central fixed electrode, may have a doughnut shape.

That is, the plurality of fixed electrodes are merely required to be aligned substantially in the direction from the center of the membrane toward its outer portion.

Accordingly, a pressure sensor device according to a preferred embodiment of the present invention includes a membrane that is conductive and deformable under pressure, a plurality of fixed electrodes each including an electrode surface opposed to the membrane, and a dielectric film disposed on the electrode surface of each of the plurality of fixed electrodes, and the plurality of fixed electrodes are disposed in a direction from a center of the membrane toward its outer portion.

A pressure sensor module according to a preferred embodiment of the present invention includes a pressure sensor device including a membrane that is conductive and deformable under pressure, a plurality of fixed electrodes each including an electrode surface opposed to the membrane, and a dielectric film disposed on the electrode surface of each of the plurality of fixed electrodes, the plurality of fixed electrodes being disposed in a direction from a center of the membrane toward its outer portion, and a sensor controller to calculate pressure to the membrane based on an electrostatic capacitance between the membrane and one of the plurality of fixed electrodes and to output the calculated value as an output pressure value therefrom. A pressure measurement range is divided into a plurality of pressure segments. In calculation of the pressure in at least one of the pressure segments, the sensor controller uses a fixed electrode with an electrostatic capacitance that changes in response to pressure changes in the pressure segment more linearly than that in the other fixed electrode(s).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor device comprising:
    a membrane that is conductive and deformable under pressure;
    a plurality of fixed electrodes each including an electrode surface opposed to the membrane; and
    a dielectric film independently disposed on the electrode surface of each of the plurality of fixed electrodes; wherein
    the membrane is configured to come into direct physical contact with the dielectric film; and
    the plurality of fixed electrodes are disposed in a direction from a center of the membrane toward an outer portion thereof.

2. The pressure sensor device according to claim 1, wherein the plurality of fixed electrodes include a central fixed electrode opposed to a central portion of the membrane.

3. The pressure sensor device according to claim 2, wherein the plurality of fixed electrodes further include an outer fixed electrode surrounding the central fixed electrode and having a ring shape.

4. The pressure sensor device according to claim 1, further comprising a float electrode disposed between neighboring fixed electrodes of the plurality of fixed electrodes and not electrically connected to the neighboring fixed electrodes.

5. The pressure sensor device according to claim 1, further comprising:
    a membrane terminal electrically connected to the membrane; and
    electrode terminals electrically connected to the plurality of fixed electrodes.

6. The pressure sensor device according to claim 1, wherein the membrane is made of a conductive silicon material.

7. The pressure sensor device according to claim 1, wherein the plurality of fixed electrodes are made of conductive polysilicon material.

8. The pressure sensor device according to claim 3, wherein the central fixed electrode and the outer fixed electrode are spaced apart from one another with a gap therebetween.

9. The pressure sensor device according to claim 3, wherein the central fixed electrode has a square or substantially square shape, and the outer fixed electrode has a square or substantially square frame shape.

10. The pressure sensor device according to claim 1, wherein the membrane is configured to come into direct physical contact with the dielectric film on one of the plurality of fixed electrodes closest to the outer portion of the membrane in the direction.

11. The pressure sensor device according to claim 4, wherein the dielectric film is independently disposed on the electrode surface of each of the plurality of fixed electrodes and an electrode surface of the float electrode that is opposed to the membrane.

12. A pressure sensor module for measuring pressure, the pressure sensor module comprising:
    a pressure sensor device including a membrane that is conductive and deformable under pressure, a plurality of fixed electrodes each including an electrode surface opposed to the membrane, and a dielectric film independently disposed on the electrode surface of each of the plurality of fixed electrodes, the plurality of fixed electrodes being disposed in a direction from a center of the membrane toward an outer portion thereof; and
    a sensor controller to calculate pressure to the membrane based on an electrostatic capacitance between the membrane and one of the plurality of fixed electrodes and to output the calculated value as an output pressure value therefrom; wherein
    the membrane is configured to come into direct physical contact with the dielectric film;
    a pressure measurement range is divided into a plurality of pressure segments; and
    in calculation of the pressure within at least one of the plurality of pressure segments, the sensor controller uses a fixed electrode of the plurality of fixed electrodes with an electrostatic capacitance that changes in response to pressure changes in the at least one of the pressure segments more linearly than that of another of the plurality of fixed electrodes.

13. The pressure sensor module according to claim 12, wherein
    the plurality of fixed electrodes include a central fixed electrode and an outer fixed electrode surrounding the central fixed electrode and having a ring shape;
    the plurality of pressure segments include a first pressure segment extending to pressure at which the membrane comes into contact with the central fixed electrode, a second pressure segment extending from the pressure at which the membrane comes into contact with the central fixed electrode to pressure at which the membrane comes into contact with the outer fixed electrode, and a third pressure segment corresponding to pressure higher than the pressure at which the membrane comes into contact with the outer fixed electrode;

the output pressure value is calculated using correction formulae for the electrostatic capacitance; and the correction formulae used for the plurality of pressure segments are different from each other.

14. The pressure sensor module according to claim 12, further comprising a float electrode disposed between neighboring fixed electrodes of the plurality of fixed electrodes and not electrically connected to the neighboring fixed electrodes.

15. The pressure sensor module according to claim 12, further comprising:

a membrane terminal electrically connected to the membrane; and electrode terminals electrically connected to the plurality of fixed electrodes.

16. The pressure sensor module according to claim 12, wherein the membrane is made of a conductive silicon material.

17. The pressure sensor module according to claim 12, wherein the plurality of fixed electrodes are made of conductive polysilicon material.

18. The pressure sensor module according to claim 13, wherein the central fixed electrode and the outer fixed electrode are spaced apart from one another with a gap therebetween.

19. The pressure sensor module according to claim 13, wherein the central fixed electrode has a square or substantially square shape, and the outer fixed electrode has a square or substantially square frame shape.

20. The pressure sensor device according to claim 12, wherein the membrane is configured to come into direct physical contact with the dielectric film on one of the plurality of fixed electrodes closest to the outer portion of the membrane in the direction.

21. The pressure sensor device according to claim 14, wherein the dielectric film is independently disposed on the electrode surface of each of the plurality of fixed electrodes and an electrode surface of the float electrode that is opposed to the membrane.

22. A pressure sensor device comprising:

a membrane that is conductive and deformable under pressure;

a plurality of fixed electrodes each including an electrode surface opposed to the membrane; and a dielectric film independently disposed on the electrode surface of each of the plurality of fixed electrodes; wherein the membrane is configured to come into direct physical contact with the dielectric film;

the plurality of fixed electrodes are disposed in a direction from a center of the membrane toward an outer portion thereof;

the plurality of fixed electrodes include a central fixed electrode opposed to a central portion of the membrane, and an outer fixed electrode surrounding the central fixed electrode and having a ring shape; and an area of the outer fixed electrode is larger than an area of the central fixed electrode.

23. The pressure sensor device according to claim 22, wherein the membrane is configured to come into direct physical contact with the dielectric film on the outer fixed electrode.

24. The pressure sensor device according to claim 22, further comprising a float electrode disposed between neighboring fixed electrodes of the plurality of fixed electrodes and not electrically connected to the neighboring fixed electrodes; wherein the dielectric film is independently disposed on the electrode surface of each of the plurality of fixed electrodes and an electrode surface of the float electrode that is opposed to the membrane.

* * * * *